(12) United States Patent
Rana et al.

(10) Patent No.: US 7,750,689 B1
(45) Date of Patent: Jul. 6, 2010

(54) HIGH VOLTAGE SWITCH WITH REDUCED VOLTAGE STRESS AT OUTPUT STAGE

(75) Inventors: Vikas Rana, Pehowa (IN); Abhishek Lal, Faridabad (IN); Promod Kumar, Ghaziabad (IN)

(73) Assignee: STMicroelectronics, PVT. Ltd., Greater Noida (UP) (IN)

( * ) Notice: Subject to any disclaimer, the term of this patent is extended or adjusted under 35 U.S.C. 154(b) by 0 days.

(21) Appl. No.: 12/343,773

(22) Filed: Dec. 24, 2008

(51) Int. Cl.
*H03K 3/00* (2006.01)
(52) U.S. Cl. ......................................... 327/108; 326/83
(58) Field of Classification Search ................. 327/108; 326/82, 83
See application file for complete search history.

(56) References Cited

U.S. PATENT DOCUMENTS 6,057,710 A * 5/2000 Singh ........................... 326/81
6,275,070 B1 * 8/2001 Pantelakis et al. ............. 326/98

* cited by examiner

*Primary Examiner*—Kenneth B. Wells
(74) *Attorney, Agent, or Firm*—Hogan Lovells US LLP

(57) ABSTRACT

The present invention discloses a high voltage switching module having reduced stress at its driver output stage which in turn controls the gate of a transistor requiring a high current drive. The switching module includes a negative elevating circuit, a delay module, a pull-up circuit, and a pull down circuit. The negative elevating circuit senses a transition of a logic input signal to generate a control signal. The first pull-up circuit is operatively coupled to this control signal for switching the driver output from a negative voltage to a ground voltage. There is an additional delay module which is configured to provide a delay in the logic input signal. This delayed logic input signal is operatively coupled to the second pull-up stage which takes the output of the driver from GND to VDD. The pull-down circuit is operatively coupled to the negative elevator for controlling a voltage at the driver output to the negative level. The module further comprises a switching circuit that is operatively coupled to the driver output for controlling the passing of a high voltage with high current requirements.

8 Claims, 4 Drawing Sheets ics to a high voltage switching module
HIGH VOLTAGE SWITCH WITH REDUCED VOLTAGE STRESS AT OUTPUT STAGE

FIELD OF THE INVENTION

The present invention relates to semiconductor memories, and more specifically to a high voltage switching module providing reduced voltage stress at its driver output.

BACKGROUND OF THE INVENTION

The invention relates to high voltage switches which need to pass high negative voltages and have high current carrying requirements. The high voltage switch consists of a wide transistor with a high drive capability and a gate control circuit for providing the gate control for the switching transistor. The high voltage switches are used in many applications both in non-volatile as well as other semiconductor circuits working at high voltage levels.

FIG. 1 illustrates a circuit diagram of a conventional high voltage switch 100. The switching arrangement includes a switching transistor 122 and a gate voltage control circuit implemented using a conventional level shifter 126. An input signal 'IN' having a first voltage level and this is converted to an output signal having a second voltage level to driving the transistor 122. The first voltage level can have a voltage range from 0 to VDD. The second voltage level can have a voltage range from VNEG to VDD.

The voltage at output nodes OUTH, OUTHN, OUT1 and OUT1N with different voltages at an input is summarized in TABLE 1.

TABLE 1

| INPUT | OUTPUT | | | |
|---|---|---|---|---|
| IN | OUTH | OUTHN | OUT1 | OUT1N |
| 0 | VNEG | VDD | VNEG | −Vt |
| VDD | VDD | VNEG | −Vt | VNEG |

As illustrated in TABLE 1, the potential range for the output node OUTH can vary from VDD to VNEG, whereas the node OUTHN is an inversion of the node OUTH. When the input signal IN changes from a LOW level (0V) to a HIGH level (VDD), then the node OUTH changes voltage levels from VNEG to VDD and during this transition phase, the transistor 112 gets stressed due to a very high Vds across it. This voltage stress is so high that the transistor 112 can go beyond the range of safe operating area. Further, due to high current drive requirement on the transistor 122, it is of high 'w' and loads the transistor 112 with a high gate capacitance, thereby increasing a load at the node OUTH makes the node OUTH slower, which increases the time during which the transistor 112 experiences the voltage stress. So if the time during which the transistor 112 experiences the voltage stress is more, it can cause a breakdown of the transistor 112 and other reliability issues. Similarly if the node OUTHN is driven by a high capacitive load, then the transistors 110 and 112 can go into a breakdown state.

The conventional circuit during transition phase has some stress related problems across its output transistors which causes reliability issues during the working.

Therefore, there is a need for a high voltage switching module that provides reduced voltage stress at its driver output.

SUMMARY OF THE INVENTION

It is an embodiment of the present invention to provide a high voltage switching module having reduced voltage stress across its output transistors.

To achieve the aforementioned embodiment, the present invention provides a high voltage switching module with reduced voltage stress at a driver output comprising:
- a negative elevating circuit for sensing a transition of a logic input signal to generate a control signal;
- a delay module configured to provide a delay in the logic input signal;
- a pull-up circuit operatively coupled to the delay module for switching the driver output from a negative voltage to a ground voltage on receiving a delayed input signal; and
- a pull-down circuit operatively coupled to the negative elevating circuit for controlling a voltage at the driver output.

Further, another embodiment provides a method for reducing voltage stress at a driver output in a high voltage switching module comprising:
- receiving a logic input signal at a negative elevating circuit;
- sensing a rising transition level on a logic input for generating a control signal to control a gate terminal of an output transistor;
- switching the driver output from a negative voltage to a ground voltage through a pull-up circuit using the control signal;
- controlling a voltage level at the driver output from the ground voltage to VDD voltage using the delay input signal through a pull-up circuit; and
- passing a high negative voltage through a switching transistor using a gate control voltage.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE INVENTION

Figure 1:
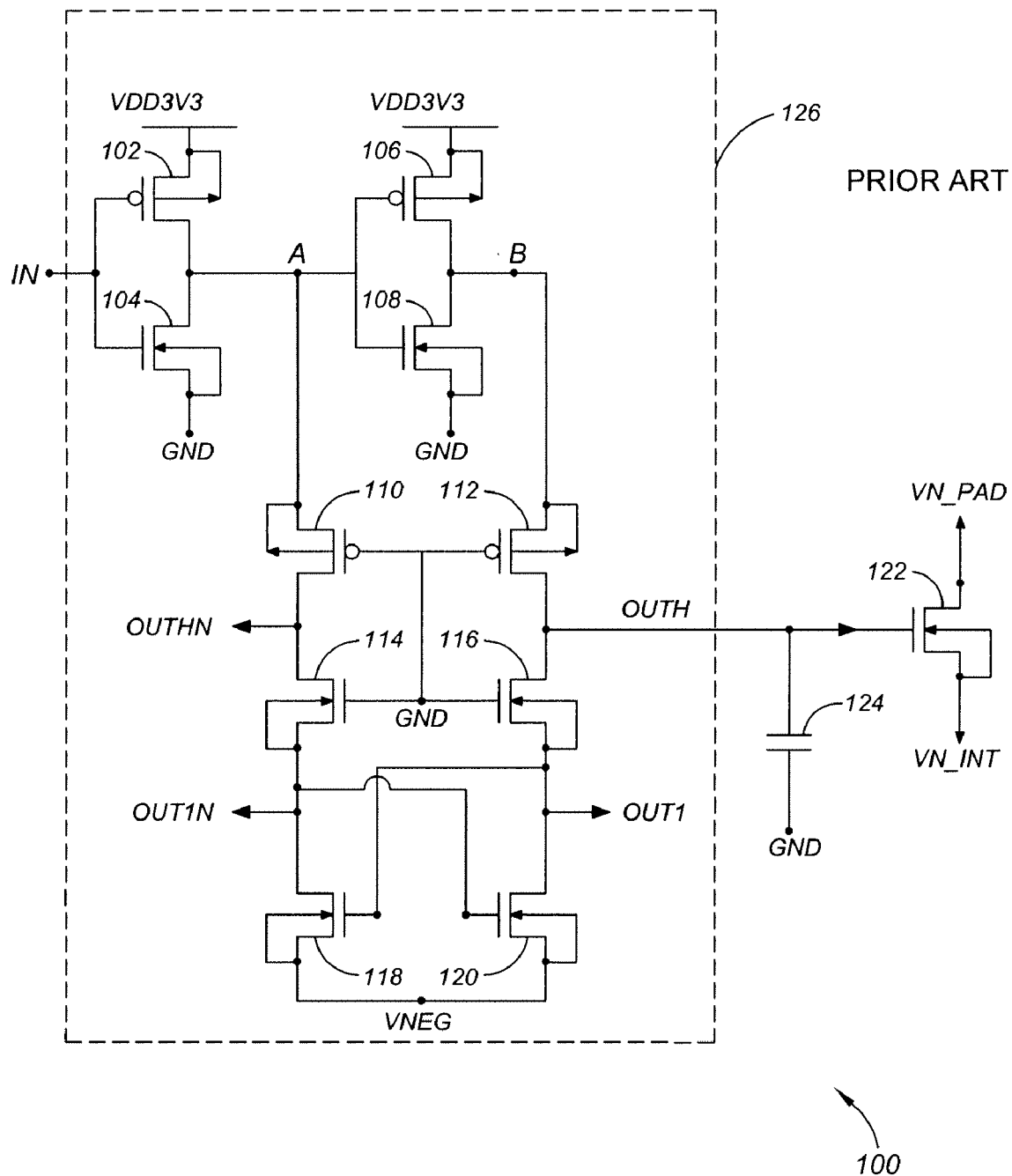
FIG. 1 illustrates a circuit diagram of a conventional high voltage switch.

The embodiments of the present invention will be described in detail with reference to the accompanying drawings. However, the present invention is not limited to the embodiments. The present invention can be modified in various forms. The embodiments of the present invention are only provided to explain more clearly the present invention to the ordinarily skilled in the art of the present invention. In the accompanying drawings, like reference numerals are used to indicate like components.

Figure 2:
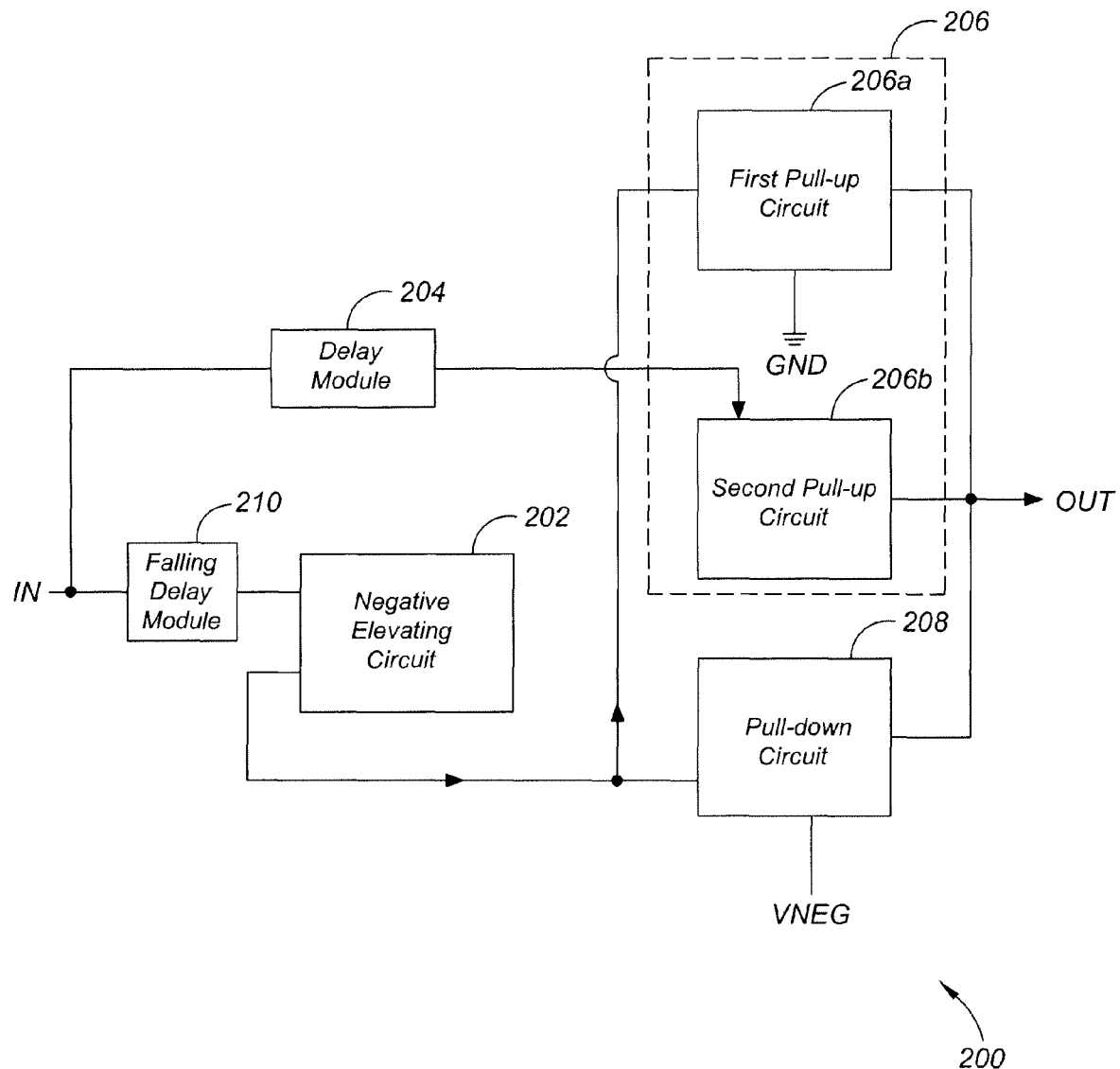
FIG. 2 illustrates a block diagram of a high voltage switching module according to an embodiment of the present invention.

FIG. 2 illustrates a block diagram of a high voltage switching module 200 according to the present invention. The high voltage switching module 200 reduces the voltage stress across its output OUT. The present invention illustrates that during the transition of voltage from a VNEG to a VHIGH (denoted by VDD3V3), a driver output OUT is made to switch in two steps. In the first step the output switches from VNEG to 0 and then in the second step, it switches from 0 to VHIGH. It is ensured that the transition at the driver output OUT during the first step takes place before the pull-up path is able to transfer VHIGH to the driver output OUT.

The high voltage switching module 200 with reduced voltage stress at the driver output includes a negative elevating circuit 202, a delay module 204, a falling delay module 210, a pull-up circuit 206, and a pull-down circuit 208. The pull up circuit 206 includes a first pull-up circuit 206a, a second pull-up circuit 206b. The negative elevating circuit 202 is used for sensing a transition of a logic input signal to generate a control signal. In an embodiment of the present invention, the transition is a rising edge transition. The delay module 204 is configured to provide a delay in the logic input signal. The second pull-up circuit 206b is connected to the delay module 204 for switching the driver output from a negative voltage (VNEG) to a ground voltage (GND) on receiving a delayed input signal IN_DELAYED. The pull-down circuit 208 is connected to the negative elevating circuit 202 for controlling a voltage at the driver output (OUT). The switching circuit is connected to the driver output (OUT) for controlling a voltage flow from a first voltage node VN_PAD to a second voltage node VN_INT. The high voltage switching module 200 is used to reduce the voltage stress of a transistor at the driver output (OUT).

Referring to FIG. 2, outputs of the negative elevating circuit 202 are left unconnected and a next stage driver is added to drive the output. The Pull-up of the driver uses a signal IN_DELAYED which is the delayed version of the original logic signal. The pull-down path now has two paths: One path to the ground voltage (GND) and a second path to the negative voltage (VNEG). Using the logic input signal (IN) going to the negative elevating circuit 202, the output of the negative elevating circuit 202 is generated. This output, which is generated earlier, is used to drive the driver output pull-down stage. The pull-down stage first activates the path from the negative voltage VNEG to the ground voltage GND and then later on the output goes from the ground voltage GND to VHIGH. If the capacitance is reduced at the node OUTH then the stress across the output transistor can be reduced because the node OUTH will be able to switch faster.

Hence, another driver stage is added to reduce the capacitance at the node that was experiencing the stress. The pull-up and pull-down path of the added driver stage is controlled by the previous stage. The pull-down path of the added driver stage is a cascoded stage and the pull-up path is a delayed version of the logic input signal.

Figure 3:
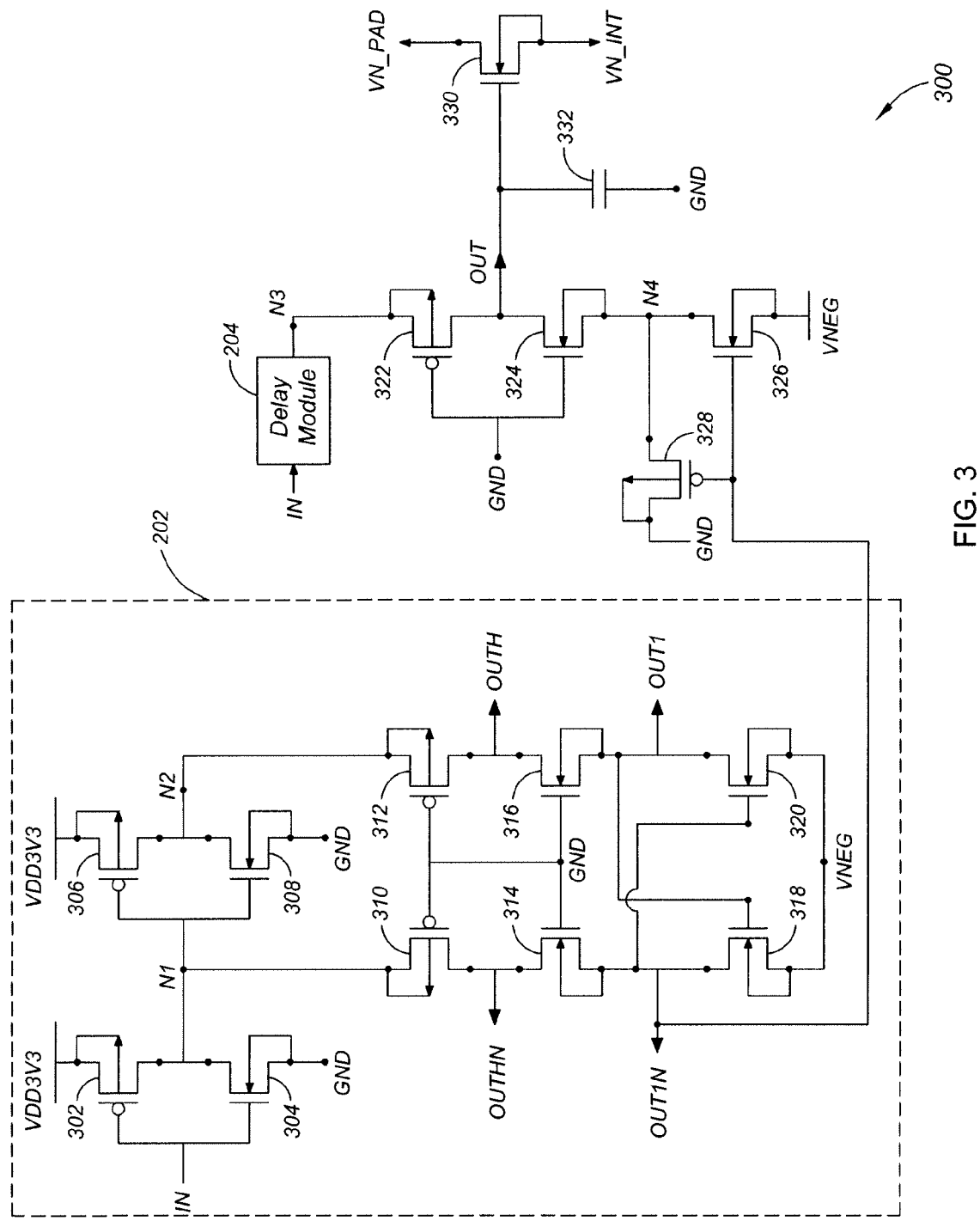
FIG. 3 illustrates a circuit diagram of a high voltage switching module according to another embodiment of the present invention.

FIG. 3 illustrates a circuit diagram of a high voltage switching module 300 with reduced voltage stress at a driver output according to an embodiment of the present invention. The high voltage switching module 300 includes a negative elevating circuit 202, a delay module 204, a pull-up circuit, and a pull-down circuit. The negative elevating circuit 202 includes a first transistor 302, a second transistor 304, a third transistor 306, a fourth transistor 308, a fifth transistor 310, a sixth transistor 312, a seventh transistor 314, an eighth transistor 316, a ninth transistor 318, and a tenth transistor 320. A gate terminal of the first transistor 302 is connected to the input port, a drain terminal is connected to a first node N1, and a source terminal and a substrate terminal are connected to a supply voltage VDD3V3. A gate terminal of the second transistor 304 is connected to the input port, a drain terminal is connected to the drain terminal of the first transistor 302 through the first node N1, and a source terminal and a substrate terminal are connected to a ground voltage GND. A gate terminal of the third transistor 306 is connected to the drain terminal of the first transistor 302 and the drain terminal of the second transistor 304 through the first node N1, a drain terminal is connected to a second node N2, and a source terminal and a substrate terminal are connected to the supply voltage VDD3V3. A gate terminal of the fourth transistor 308 is connected to the drain terminal of the first transistor 302 and the drain terminal of the second transistor 304 through the first node N1, a drain terminal is connected to the second node N2, and a source terminal and a substrate terminal are connected to the ground voltage GND. A gate terminal of the fifth transistor 310 is connected to the ground voltage GND, a drain terminal is connected to a first output node OUTHN, and a source terminal and a substrate terminal are connected to the first node N1. A gate terminal of the sixth transistor 312 is connected to the ground voltage GND, a drain terminal is connected to a second output node OUTH, and a source terminal and a substrate terminal are connected to the second node N2. A gate terminal of the seventh transistor 314 is connected to the ground voltage GND, a drain terminal is connected to the drain terminal of the fifth transistor 310 through the first output node OUTHN, and a source terminal and a substrate terminal are connected to a third output node OUT1N. A gate terminal of the eighth transistor 316 is connected to the ground voltage GND, a drain terminal is connected to the second output node OUTH, and a source terminal and a substrate terminal are connected to a fourth output node OUT1. A gate terminal of the ninth transistor 318 is connected to the source terminal and the substrate terminal of the eighth transistor 316 through the fourth output node OUT1, and a source terminal and a substrate terminal are connected to a negative voltage VNEG. A gate terminal of the tenth transistor 320 is connected to the source terminal and the substrate terminal of the seventh transistor 314 through the third output node OUT1N, and a source terminal and a substrate terminal of the tenth transistor 320 are connected to the negative voltage VNEG.

The pull-up circuit includes an eleventh transistor 322. A gate terminal of the eleventh transistor 322 is connected to the ground voltage (GND), a drain terminal is connected to a driver output (OUT), and a source terminal and a substrate terminal are connected to the delay module 204 through a third node N3.

The pull-down circuit includes a twelfth transistor 324, a thirteenth transistor 326 and a fourteenth transistor 328. A gate terminal of the twelfth transistor 324 is connected to the ground voltage (GND), a drain terminal is connected to the drain terminal of the eleventh transistor 322 through the driver output (OUT), and a source terminal and a substrate terminal are connected to a fourth node N4. A gate terminal of the thirteenth transistor 326 is connected to the third output node (OUT1N), a drain terminal is connected to the fourth node N4 and a source terminal and a substrate terminal are connected to the negative voltage (VNEG). A gate terminal of the fourteenth transistor 328 is connected to the third output node (OUT1N), a drain terminal is connected to the fourth node N4, and a source terminal and a substrate terminal are connected to the ground voltage GND.

In an embodiment, a switching circuit includes a fifteenth transistor 330 and a capacitor 332. A gate terminal of the fifteenth transistor 330 is connected to the driver output (OUT), a drain terminal is connected to the first voltage node (VN_PAD), and a source terminal and a substrate terminal are connected to a second voltage node (VN_INT). The capacitor 332 is connected between the driver output (OUT) and the ground voltage (GND). The fifteenth transistor 330 is also known as a switching transistor 330.

The high voltage switching module 300 is used to reduce the voltage stress across a transistor 312. The buffer stage includes one rising edge delay circuit 204, two transistors 322 and 324 are used as cascode stage and the transistors, such as 326 and 328 are used as pass transistors. Final output is taken from the output node (OUT) which varies from 3.3V to VNEG depending on the input signal (IN). Referring to FIG. 3, the signal at the node (OUT1N) has been applied to the gate of pull-down switch 326, whose drain is at the negative voltage (VNEG). The source of the transistor 326 is further cascoded through transistor 324. The transistor 328 acts as a pull-up device whose gate is controlled by the signal at the node (OUT1N). Here the node (OUT) is the driver output and finds maximum capacitance which is represented by switch 330 and a parasitic capacitor 332 connected as a load.

When the input IN is low, the first output node (OUTHN) sets to 3.3V and the second output node (OUTH) sets to the negative voltage (VNEG). Similarly, the third output node (OUT1N) sets to −Vt and the fourth output node (OUT1) sets to the negative voltage VNEG. As the third output node (OUT1N) controls the gate of the pull-down switch 326, it passes the negative voltage (VNEG) to the driver output (OUT) which can further drive the load. When the input signal (IN) changes from a low to a high state i.e. from 0 to 3.3V, the second output node (OUTH) changes from VNEG to 3.3V. As the second output node (OUTH) does not see any capacitance or load its switching will be fast and the transistor 312 will be stressed for a very small time.

It may appear that pull-up switch 322 also faces the same kind of high voltage switching, but that stress is limited by the pull-down path (switches 326 and 328) as illustrated. When the input signal IN changes from 0 to 3.3V, the third output node (OUT1N) changes from −Vt to VNEG. As the third output node (OUT1N) approaches towards VNEG level, it will switch off the transistor 326 and switch ON the transistor 328. The transistor 328 will pull the node N4 to the ground (0V) level. So the driver output OUT will quickly reach to the ground level. Further the rising edge of the signal IN is delayed and applied to the source of the transistor 322. Before reaching the N3 node to 3.3V, the driver output (OUT) reaches to the ground level. The delay module 204 can be adjusted in a way that the driver output (OUT) discharges to the ground level before N3 arrives. Hence the pull-up transistor 322 is not stressed even though the driver output OUT sees a very high capacitance.

Figure 4:
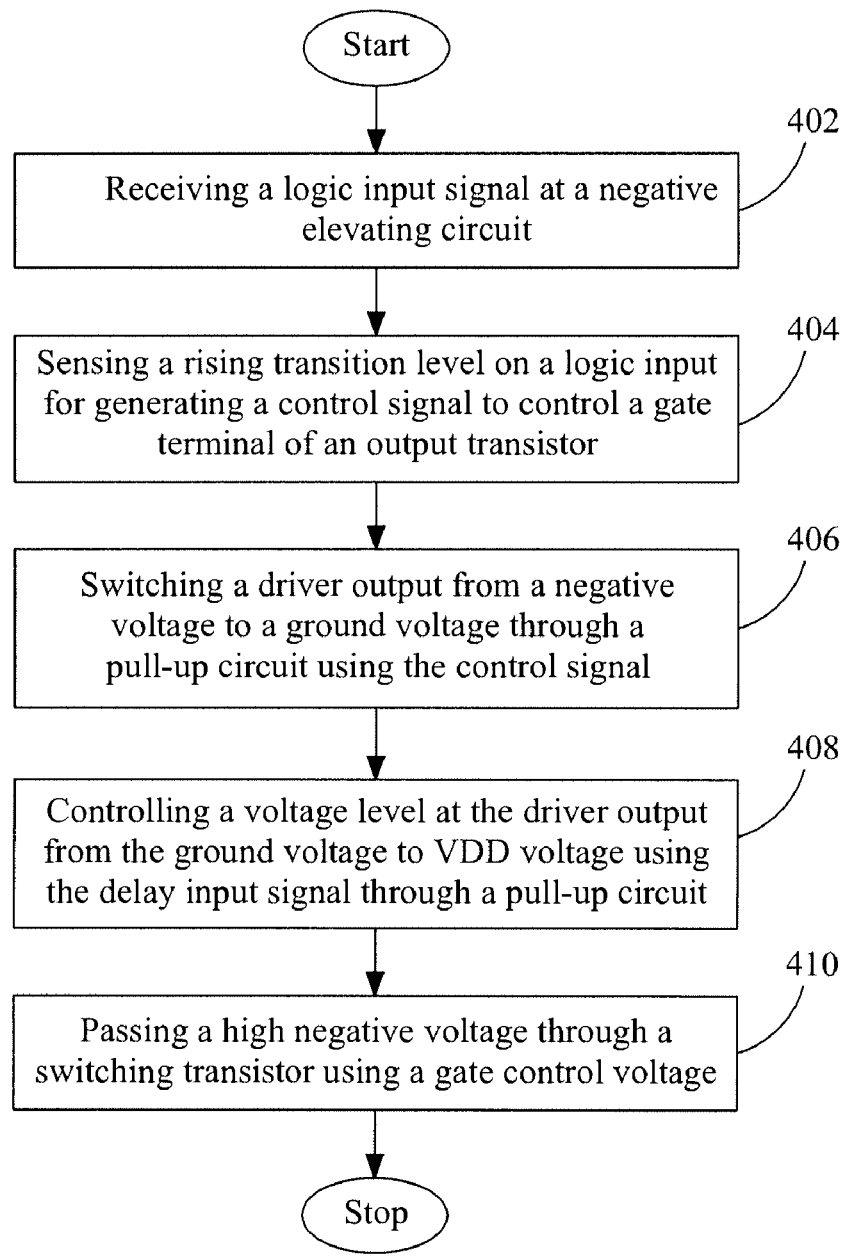
FIG. 4 illustrates a flow diagram of a method for reducing voltage stress at a driver output in a high voltage switching module according to an embodiment of the present invention.

FIG. 4 illustrates a flow diagram of a method for reducing voltage stress at a driver output in a high voltage switching module according to the present invention. At step 402, a logic input signal is received at a negative elevating circuit. At step 404, a rising transition level on a logic input is sensed for generating a control signal to control a gate terminal of an output transistor. At step 406, the driver output is switched from a negative voltage to a ground voltage through a pull-up circuit using the control signal. At step 408, a voltage level is controlled at the driver output from the ground voltage to VDD voltage using the delay input signal through a pull-up circuit. At step 410, a high negative voltage is passed through a switching transistor using a gate control voltage.

Accordingly, embodiments of the present invention comprise a high voltage switching module having reduced stress at its driver output stage which in turn controls the gate of a transistor requiring a high current drive. The switching module includes a negative elevating circuit, a delay module, two separate pull-up circuits, and a pull down circuit. The negative elevating circuit senses a transition of a logic input signal to generate a control signal. The first pull-up circuit is operatively coupled to this control signal for switching the driver output from a negative voltage to a ground voltage. There is an additional delay module which is configured to provide a delay in the logic input signal. This delayed logic input signal is operatively coupled to the second pull-up stage which takes the output of the driver from GND to VDD. The pull-down circuit is operatively coupled to the negative elevator for controlling a voltage at the driver output to the negative level. The module further comprises a switching circuit that is operatively coupled to the driver output for controlling the passing of a high voltage with high current requirements.

The present invention offers several advantages. Firstly, the present invention provides a high voltage switching module for reducing voltage stress across an output transistor. Secondly, the present invention allows the output transistor to run in a safe operating area.

Although the disclosure of system and method has been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

We claim:

1. A high voltage switching module comprising:
    a negative elevating circuit for sensing a transition of a logic input signal to generate a control signal;
    a delay module configured to provide a delay to the logic input signal;
    a pull-up circuit operatively coupled to the delay module for switching a driver output from a negative voltage to a ground voltage on receiving the delayed logic input signal; and
    a pull-down circuit operatively coupled to the negative elevating circuit for controlling a voltage at the driver output.

2. The module as claimed in claim 1, wherein said transition comprises a rising edge transition.

3. The module as claimed in claim 1, wherein said negative elevating circuit comprises:
    a first transistor having a gate terminal connected to an input port, a drain terminal connected to a first node, and a source terminal and a substrate terminal connected to a supply voltage;
    a second transistor having a gate terminal connected to the input port, a drain terminal connected to the drain terminal of the first transistor through the first node, and a source terminal and a substrate terminal connected to a ground voltage;
    a third transistor having a gate terminal connected to the drain terminal of the first transistor and the drain terminal of the second transistor through the first node, a drain terminal connected to a second node, and a source terminal and a substrate terminal connected to the supply voltage;
    a fourth transistor having a gate terminal connected to the drain terminal of the first transistor and the drain terminal of the second transistor through the first node, a drain terminal connected to the second node, and a source terminal and a substrate terminal connected to the ground voltage;
    a fifth transistor having a gate terminal connected to the ground voltage, a drain terminal connected to a first output node, and a source terminal and a substrate terminal connected to the first node;

a sixth transistor having a gate terminal connected to the ground voltage, a drain terminal connected to a second output node, and a source terminal and a substrate terminal connected to the second node;

a seventh transistor having a gate terminal connected to the ground voltage, a drain terminal connected to the drain terminal of the fifth transistor through the first output node, and a source terminal and a substrate terminal connected to a third output node;

an eighth transistor having a gate terminal connected to the ground voltage, a drain terminal connected to the second output node, and a source terminal and a substrate terminal connected to a fourth output node;

a ninth transistor having a gate terminal connected to the source terminal and the substrate terminal of the eighth transistor through the fourth output node, and a source terminal and a substrate terminal connected to a negative voltage; and a tenth transistor having a gate terminal connected to the source terminal and the substrate terminal of the seventh transistor through the third output node, and a source terminal and a substrate terminal connected to the negative voltage.

4. The module as claimed in claim 1, wherein said pull-up circuit comprises:

an eleventh transistor having a gate terminal connected to the ground voltage, a drain terminal connected to the driver output, and a source terminal and a substrate terminal connected to the delay module.

5. The module as claimed in claim 1, wherein said pull-down circuit comprises a twelfth transistor having a gate terminal connected to the ground voltage, a drain terminal connected to the drain terminal of the eleventh transistor through the driver output, and a source terminal and a substrate terminal connected to a fourth node;

a thirteenth transistor having a gate terminal connected to the third output node, a drain terminal connected to the fourth node and a source terminal and a substrate terminal connected to the negative voltage; and a fourteenth transistor having a gate terminal connected to the third output node, a drain terminal connected to the fourth node, and a source terminal and a substrate terminal connected to the ground voltage.

6. The module as claimed in claim 1 further comprising a switching circuit operatively coupled to the driver output for controlling a voltage flow.

7. The module as claimed in claim 6, wherein said switching circuit comprises:

a fifteenth transistor having a gate terminal connected to the driver output, a drain terminal connected to a first voltage node, and a source terminal and a substrate terminal connected to a second voltage node; and a capacitor connected between the driver output and the ground voltage.

8. A method for reducing voltage stress at a driver output in a high voltage switching module comprising:

receiving a logic input signal at a negative elevating circuit;

sensing a rising transition level of the logic input signal for generating a control signal to control a gate terminal of an output transistor;

switching the driver output from a negative voltage to a ground voltage through a pull-up circuit using the control signal;

delaying the logic input signal;

controlling a voltage level at the driver output from the ground voltage to VDD voltage using the delayed logic input signal through a pull-up circuit; and passing a high negative voltage through a switching transistor using a gate control voltage.

* * * * *